United States Patent
Pelella et al.

(10) Patent No.: US 11,682,452 B2
(45) Date of Patent: Jun. 20, 2023

(54) LOCAL BIT SELECT WITH IMPROVED FAST READ BEFORE WRITE SUPPRESSION

(71) Applicant: International Business Machines Corporation, Armonk, NY (US)

(72) Inventors: Antonio Pelella, Highland Falls, NY (US); Dongho Lee, Poughkeepsie, NY (US); Genadi Tverskoy, Poughkeepsie, NY (US); Zhiying Chen, Poughkeepsie, NY (US); Brian James Yavoich, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 105 days.

(21) Appl. No.: 17/480,191

(22) Filed: Sep. 21, 2021

(65) Prior Publication Data
US 2023/0086799 A1    Mar. 23, 2023

(51) Int. Cl.
| | |
|---|---|
| *G11C 7/12* | (2006.01) |
| *G11C 11/412* | (2006.01) |
| *H03K 19/017* | (2006.01) |
| *G11C 11/419* | (2006.01) |
| *G11C 11/413* | (2006.01) |
| *G11C 7/10* | (2006.01) |

(52) U.S. Cl.
CPC .......... *G11C 11/412* (2013.01); *G11C 11/413* (2013.01); *G11C 11/419* (2013.01); *H03K 19/01742* (2013.01); *G11C 7/1078* (2013.01); *G11C 2207/002* (2013.01)

(58) Field of Classification Search
CPC ... G11C 11/412; G11C 11/413; G11C 11/419; G11C 7/1078; G11C 2207/002; H03K 19/01742
See application file for complete search history.

(56) References Cited

U.S. PATENT DOCUMENTS

| | | |
|---|---|---|
| 5,953,259 A | 9/1999 | Yoon et al. |
| 6,990,038 B1 | 1/2006 | Chan et al. |

(Continued)

OTHER PUBLICATIONS

Chun et al., "A 667 MHz Logic-Compatible Embedded DRAM Featuring an Asymmetric 2T Gain Cell for High Speed On-Die Caches," IEEE Journal of Solid-State Circuits, vol. 47, No. 2, Feb. 2012, pp. 547-559.

*Primary Examiner* — Mushfique Siddique
(74) *Attorney, Agent, or Firm* — Cantor Colburn LLP; Jeffrey Ingalls

(57) ABSTRACT

Aspects of the invention include a first pull-down device and a second pull-down device, wherein a first drain terminal is connected to a second source terminal, and wherein a first gate terminal is connected to a true read local bitline, wherein a second drain terminal is connected to a compliment read local bit line, and wherein a second gate terminal is connected to a true write global bitline, a third pull-down device and a fourth pull-down device, wherein a third source terminal is connected to the voltage supply, wherein a third drain terminal is connected to a fourth source terminal, and wherein a third gate terminal is connected to the compliment read local bitline, and wherein a fourth drain terminal is connected to the true read local bitline, and wherein a fourth gate terminal is connected to a compliment write global bit line.

19 Claims, 7 Drawing Sheets

(56) References Cited

U.S. PATENT DOCUMENTS

| | | | |
|---|---|---|---|
| 7,102,946 B2 * | 9/2006 | Pelella | G11C 11/419 |
| | | | 365/208 |
| 7,113,433 B2 * | 9/2006 | Chan | G11C 11/413 |
| | | | 365/189.11 |
| 7,535,776 B1 | 5/2009 | Behrends et al. | |
| 8,184,475 B2 | 5/2012 | Joshi et al. | |
| 8,638,595 B2 * | 1/2014 | Pelella | G11C 11/413 |
| | | | 365/189.08 |
| 9,153,304 B2 | 10/2015 | Kulkarni et al. | |
| 2006/0176747 A1 * | 8/2006 | Bunce | G11C 7/18 |
| | | | 365/203 |
| 2011/0199817 A1 * | 8/2011 | Joshi | G11C 11/413 |
| | | | 365/225.7 |
| 2011/0292748 A1 * | 12/2011 | Adams | G06F 30/30 |
| | | | 716/126 |
| 2017/0243619 A1 * | 8/2017 | Bunce | G11C 7/12 |

\* cited by examiner

LOCAL BIT SELECT WITH IMPROVED FAST READ BEFORE WRITE SUPPRESSION

BACKGROUND

The present invention generally relates to computer memory, and more specifically, to local bit select with improved fast read before write suppression.

A static semiconductor memory typically includes six-transistor cells in which four transistors are configured as a cross-coupled latch for storing data. The remaining two transistors are used to obtain access to the memory cell. During a read access, differential data stored in the memory cell is transferred to the attached bit line pair. A sense amplifier senses the differential voltage that develops across the bit line pair. During a write access, data is written into the memory cell through the differential bit line pair. Typically, one side of the bit line pair is driven to a logic low level potential and the other side is driven to a high voltage level. The cells are arranged in an array that has a grid formed of bit lines and word lines, with the memory cells disposed at intersections of the bit lines and the word lines. The bit lines and the word lines are selectively asserted or negated to enable at least one cell to be read or written to.

SUMMARY

Embodiments of the present invention are directed to a local bit-select circuit. A non-limiting example includes a first set of pull-down devices including a first pull-down device and a second pull-down device, wherein a first source terminal of the first pull-down device is connected to a voltage supply, wherein a first drain terminal of the first pull-down device is connected to a second source terminal of the second pull-down device, and wherein a first gate terminal of the first pull-down device is connected to a true read local bitline, wherein a second drain terminal of the second pull-down device is connected to a compliment read local bit line, and wherein a second gate terminal of the second pull-down device is connected to a true write global bitline, a second set of pull-down devices including a third pull-down device and a fourth pull-down device, wherein a third source terminal of the third pull-down device is connected to the voltage supply, wherein a third drain terminal of the third pull-down device is connected to a fourth source terminal of the fourth pull-down device, and wherein a third gate terminal of the third pull-down device is connected to the compliment read local bitline, and wherein a fourth drain terminal of the fourth pull-down device is connected to the true read local bitline, and wherein a fourth gate terminal of the fourth pull-down device is connected to a compliment write global bit line.

Other embodiments of the present invention implement features of the above-described circuit including an integrated circuit and a method for operation.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
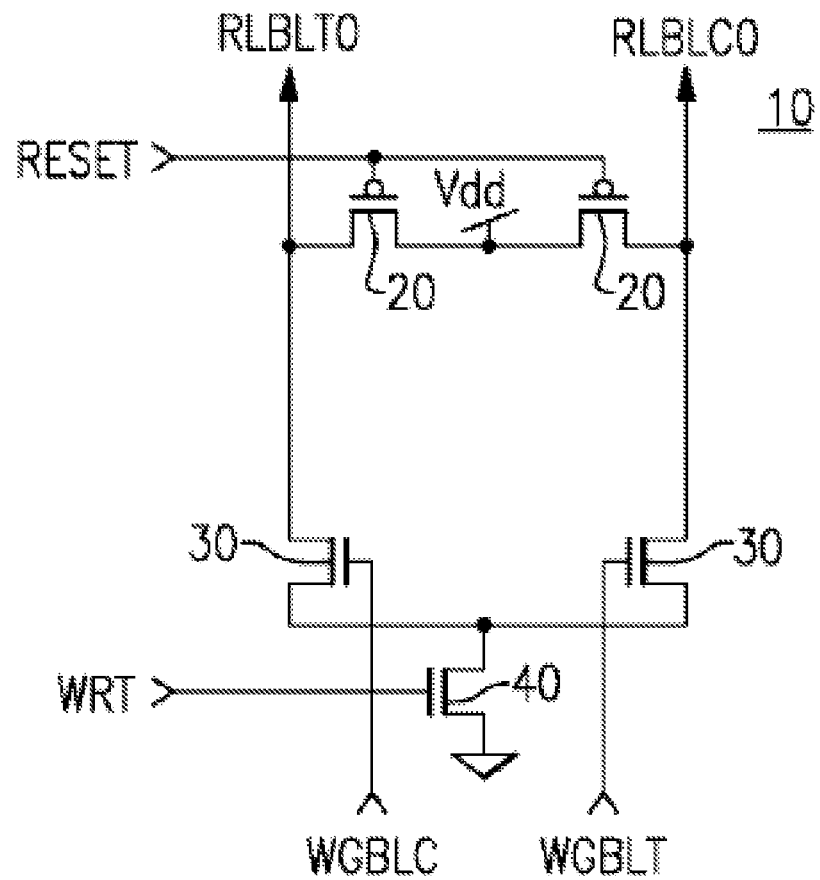
FIG. 1 depicts a typical prior art local bit-select circuit.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provides for a static random-access memory SRAM circuit that allows both the read function and the write function to be optimized to avoid errors related to a fast read before write (FRBW) situation as described in further detail below with respect to a local bit-select circuit.

In SRAM design, the cells are arranged into groups of cells, typically on the order of eight to sixteen cells per group. Each cell in a group is connected to a local bit line pair. The local bit line pair for each group of cells is coupled to a global bit line pair. Rather than using a sense amplifier to detect a differential voltage when reading a cell, in a domino SRAM the local bit lines are precharged and discharged by the cell in a read operation, which where a discharge is detected and the discharge determines the state of the cell. The local bit line, the precharge means, and the detection means define a dynamic node of the domino SRAM. In a domino SRAM array, in the read operation the cell must produce a bit line voltage large enough to drive off the SRAM macro with no help from a sense amplifier. In this situation, the "write" operation becomes the primary design focus due to a situation called "Fast Read before Write".

The problem occurs when a cell is slow to write but very fast to read, which can result in both of the local bit lines being pulled down to ground making the cell un-writable. For example, during a write to the opposite state, the "write transistor" in the "local bit selector" pulls down on one "local bit line", while the cell pulls down on the opposite "local bit line", resulting in both "local bit lines" being pulled down to ground, thereby preventing the cell from writing. A cell that is slow to write, but very fast to read, is caused by manufacturing process variations. Due to device parametric variations, the p-type field effect transistor (PFET) could be skewed to the strong side and the n-type field effect transistor (NFET) to the weak side, making the NFET pass gate more difficult to overcome the PFET in a write operation. If the device and metal capacitance is on the low side, and the NFET pass gate threshold voltage Vt is low, the cell could have a fast read.

The problem occurs when a cell is slow to write but very fast to read, which can result in both of the local bit lines being pulled down to ground making the cell un-writable. For example, during a write to the opposite state, the "write transistor" in the "local bit selector" pulls down on one "local bit line", while the cell pulls down on the opposite "local bit line", resulting in both "local bit lines" being pulled down to ground, thereby preventing the cell from writing. A cell that is slow to write, but very fast to read, is caused by manufacturing process variations. Due to device parametric variations, the p-type field effect transistor (PFET) could be skewed to the strong side and the n-type field effect transistor (NFET) to the weak side, making the NFET pass gate more difficult to overcome the PFET in a write operation. If the device and metal capacitance is on the low side, and the NFET pass gate threshold voltage Vt is low, the cell could have a fast read.

A similar problem can occur when a timing mismatch takes place between the "row" select and the "column" select lines. For example, if the row line becomes active before the write signal arrives at the "local bit select", the cell is in read mode before the write can occur, resulting in a similar situation where both "local bit lines" are pulled down to ground leaving the cell in a "un-writeable" state. This "Fast Read before Write" is not a problem in traditional SRAM designs using sense amp's because the "bit selector" used there has bit line clamps to prevent this from occurring. Also, the traditional approach has more cells on a bit line (i.e., on the order of 128-to-256 cells vs. 8-to-16 cell) making the bit lines much more capacitive and much slower to develop a voltage differential; therefore, making it less likely to have the "Fast Read before Write" situation even without the clamps. One way to minimize the problem in Domino Read SRAMs is to "push-out" the "row" select signal to guarantee the "write data" is available to the local bit line before the cell is selected. However, some cells will still cause a "Fast Read before Write" because they are "slow to write but very fast to read" even though they are within the normal manufacturing window. This solution results in a performance slow-down and does not solve or prevent the un-writeable state.

FIG. 1 depicts a typical local bit-select circuit 10. As seen in FIG. 1, a local bit-select circuit 10 includes a pair of pull-up devices 20 or "reset" devices which can be implemented using p-type field effect transistors ("PFETs") having source terminals connected to a power supply voltage Vdd and drain terminals connected to the respective read local bitlines RLBLT0 and RLBLC0. These devices 20 can be used to pull up the value of the read local bitlines to Vdd prior to reading from or writing to a memory cell connected to the read local bitlines. The power supply voltage Vdd typically supplies power to each of the memory cells of an SRAM.

The local bit-select circuit 10 shown in FIG. 1 also includes pull-down devices 30, which can be implemented using n-type field effect transistors ("NFETs"), for example. The pull-down devices have gates connected to a true and compliment write global bitlines WGBLT and WGBLC and sources connected to a drain of a write control device 40. During a write operation, the SRAM memory cell is activated to be written, such as by raising a voltage on a wordline connected to the memory cell. At that time, the write global bitlines WGBLT and WGBLC are supplied with write bit values. Then, a write control signal (WRT) draws current through the write control device 40, which in turn, activates the pull-down devices 30 to cause the bit value on one of RLBLT0 and RLBLC0 to be driven to the low signal level.

However, a problem occurs when there is a timing mismatch between some signals. When the write control signal is delayed in relation to the wordline activation, the activated memory cell can operate in a way that resembles a read operation from the selected memory cell. In other words, the delay of the write control signal can cause the value stored in the selected memory cell to begin driving a read signal from the selected memory cell onto one of the read local bitlines. For example, a read signal can drive the bit signal value on one of the pair of true and compliment read local bitlines RLBLT0 and RLBLC0 to a low signal level. Such problem can be referred to as a "false" read, wherein a strong signal from one of the memory cells on the read local bitlines can interfere with writing the same memory cell. The read signal appearing on the read local bitline can make it harder to write the new value to the memory cell when the write control signal arrives to begin writing the selected memory cell. For example, if the signal to be written on the read local bitline RLBLT0 is a high signal level, a low signal level appearing as a read signal on RLBLT0 can interfere with driving the high signal level on that read local bitline.

Figure 2:
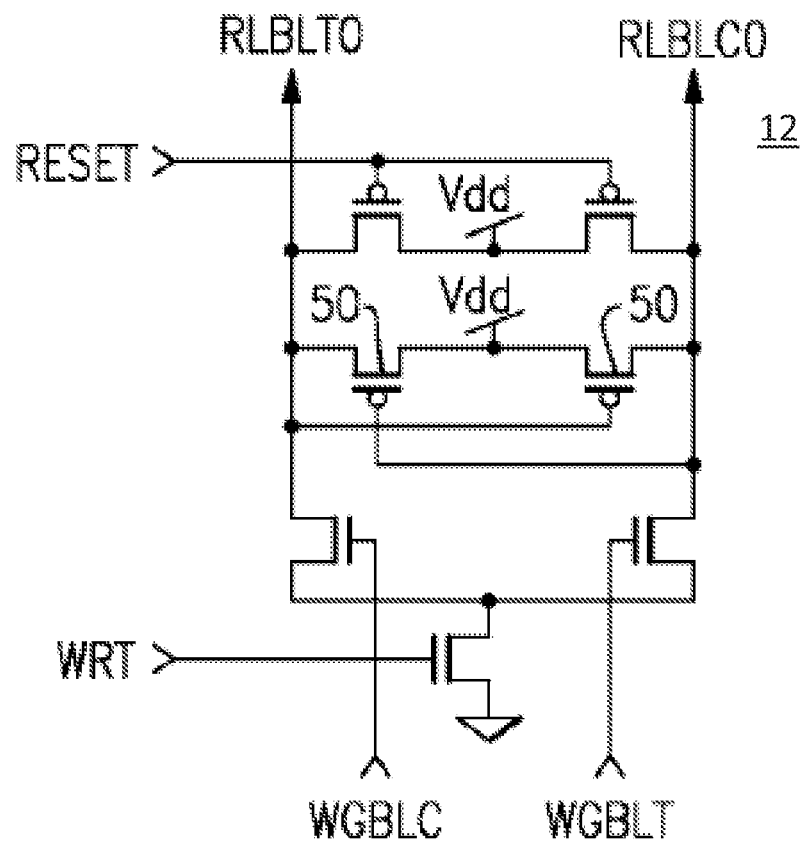
FIG. 2 depicts a prior art local bit-select circuit featuring cross-coupled PFETs.

Other local bit-select circuits have been created to attempt to address this concern. FIG. 2 depicts a local bit-select circuit featuring cross-coupled PFETs. The local bit-select circuit 12 includes a pair of cross-coupled PFETs 50 used to latch the signals on the read local bitlines RLBLT0 and RLBLC0. One effect of such approach is that the cross-coupled PFETs can latch values on the read local bitlines in the interval between a time that RESET is active and when WRT becomes active. Before the WRT signal becomes active, the read local bitlines RLBLT0 and RLBLC0 can have noise thereon or a combination of noise with read signals from the memory cell which is being written at the time. While the cross-coupled PFETs 50 may be able to switch from a state latched prior to the WRT signal to a different state when the WRT signal arrives, the local bitline control circuit may have to work hard to overcome the earlier latched state produced by the cross-coupled PFETs 50. A potential effect of such approach is that the circuit may need greater current or more time to change the state of the read local bitlines RLBLT0 and RLBLC0 from the state prior to the WRT signal to the state dictated by the WGBLT and WGBLC signals for writing the memory cell.

Figure 3:
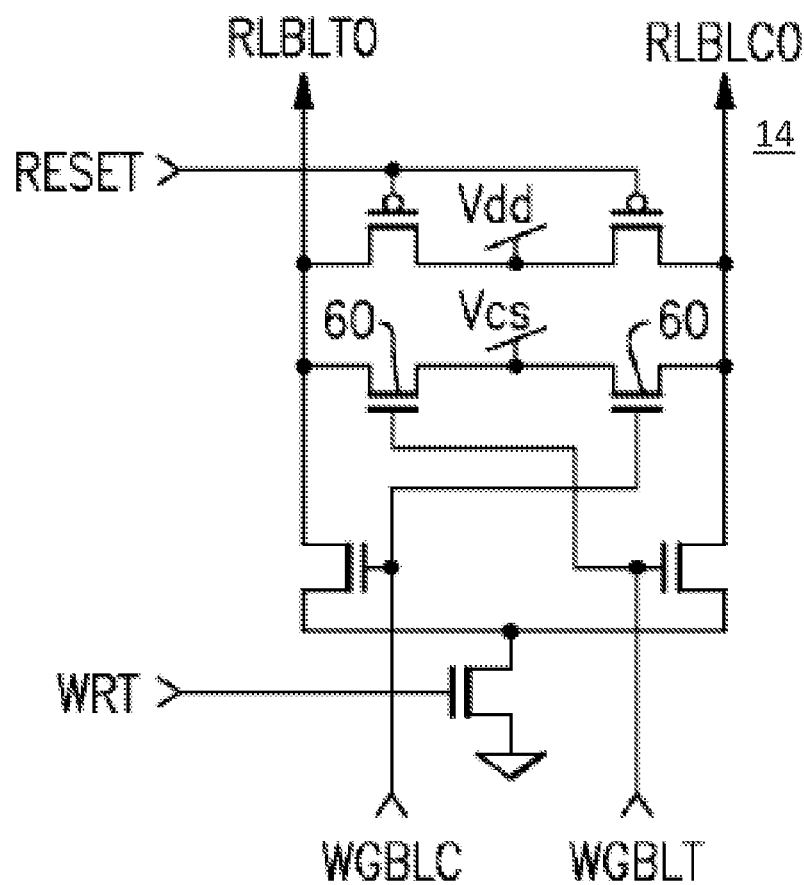
FIG. 3 depicts a prior art local bit-select circuit featuring cross-coupled NFETs.

FIG. 3 depicts a local bit-select circuit featured cross-coupled NFETs. The local bit-select circuit 14 includes a pair of cross-coupled NFETs 60 used to latch values on the read local bitlines RLBLT0 and RLBLC0. As seen in FIG. 3, the cross-coupled NFETs 60 can be supplied at the drains thereof with a column select power supply voltage (Vcs). Such power supply voltage can be raised above the level of the regular power supply (Vdd) to memory cells of the SRAM by an amount of the NFET threshold voltage $V_T$, so that the cross-coupled NFETs 60 can latch signals on the read local bitlines RLBLT0 and RLBLC0 at full rail-to-rail levels. A potential disadvantage of such approach is that the circuit may need greater current or more time to latch the read local bitlines RLBLT0 and RLBLC0 to the states dictated by the WGBLT and WGBLC signals for writing the memory cell.

Turning now to an overview of the aspects of the invention, one or more embodiments of the invention address the above-described shortcomings of the prior art by providing a local bit-select circuit that combines the best features of the above described cross-coupled NFETs and cross-coupled PFETs through the use of a gated cross-coupled PFET stack.

Figure 4:
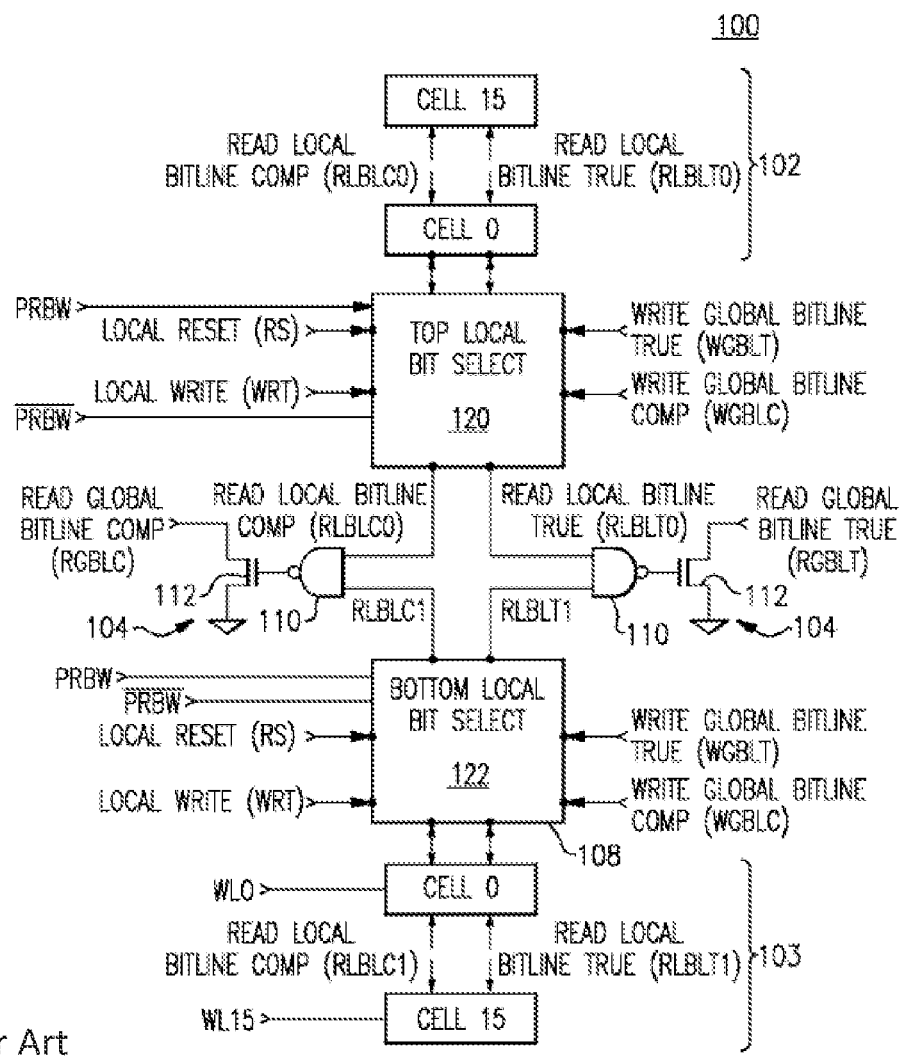
FIG. 4 depicts a prior art SRAM according to one or embodiments of the invention.

Turning now to a more detailed description of aspects of the present invention, FIG. 4 depicts an SRAM according to embodiments of the invention. As seen in FIG. 4, the SRAM includes a top memory array 102 and a bottom memory array 103. The "top" and "bottom" refer to different locations of the SRAM, but do not necessarily refer to top and bottom layout locations. Moreover, "top" and "bottom" typically do not refer to elements which are disposed at a top and a bottom in a gravitational frame of reference. Each of the memory arrays 102, 103 includes a multiplicity of memory cells which are arranged in a plurality of columns and a plurality of rows. One column of each memory array is shown in FIG. 4, each column illustratively shown having 16 memory cells numbered Cell 0 through Cell 15, the memory cells of each memory array being connected to a read local bitline complement (RLBLC0) and a read local bitline true (RLBLT0) which operate as busses for the transfer of bit values to and from the memory cells of each column. Typically, each memory array 102 will have many columns. For ease of description, the full number of columns of each memory array is omitted from FIG. 4. The number of rows of a memory array typically matches the number of memory cells in each column, such that in the example shown in FIG. 4, each memory array has 16 rows. The memory cells of each row of a memory array 102 or 103 can be activated for read or write operations by altering the voltage on a wordline connected thereto, e.g., wordline WL0 connected to memory cell 0 of array 103, and wordline WL15 connected to memory cell 15 of array 103.

As also seen in FIG. 4, the SRAM includes global read circuits 104, a top local bit-select circuit 106, a bottom local bit-select circuit 108, and associated control signals, which will be described in further detail below. The purpose of each global read circuit 104 is to buffer a read signal from the memory cell being read in one of the memory arrays 102, 103 and to provide the buffered read signal to external circuitry (not shown) of the SRAM. The global read circuits 104 include logic gates 110 having inputs connected to read local bitlines RLBLT0, RLBLC0 of the column for the memory array 102, and to the read local bitlines RLBLT1, RLBLC1 of the column for the memory array 103. When reading the value stored in a memory cell, a wordline connected to a memory cell is activated, for example, WL15 connected to memory cell 15 of bottom memory array 103 is activated, causing the bit value stored in memory cell 15 to be transmitted onto the read local bitlines RLBLT1 and RLBLC1. The logic gates 110 and the pull-down devices 112 then buffer the RLBLT1, RLBLC1 values, thus outputting the values onto the paired signal lines of read global bitline true (RGBLT) and read global read bitline complement (RGBLC). The read global bitline signals RGBLT and RGBLC then can be transferred to an external circuit, such as to a data input output circuit (not shown) for the SRAM or a data input output circuit for the integrated circuit in which the SRAM is incorporated.

A top local bit select circuit 120 is provided for memory array 102 and a bottom local bit select circuit 122 is provided for memory array 103. These circuits share the global read circuits 104 and receive the same pair of signals write global bitline true (WGBLT) and write global bitline compliment (WGBLC). However, each of the top bit-select circuit 120 and the bottom bit-select circuit 122 receives a local reset (RS) signal and a local write (WRT) signal which is independent from the local reset (RS) signal and local write (WRT) signal provided to the other one of the bit-select circuits.

Figure 5:
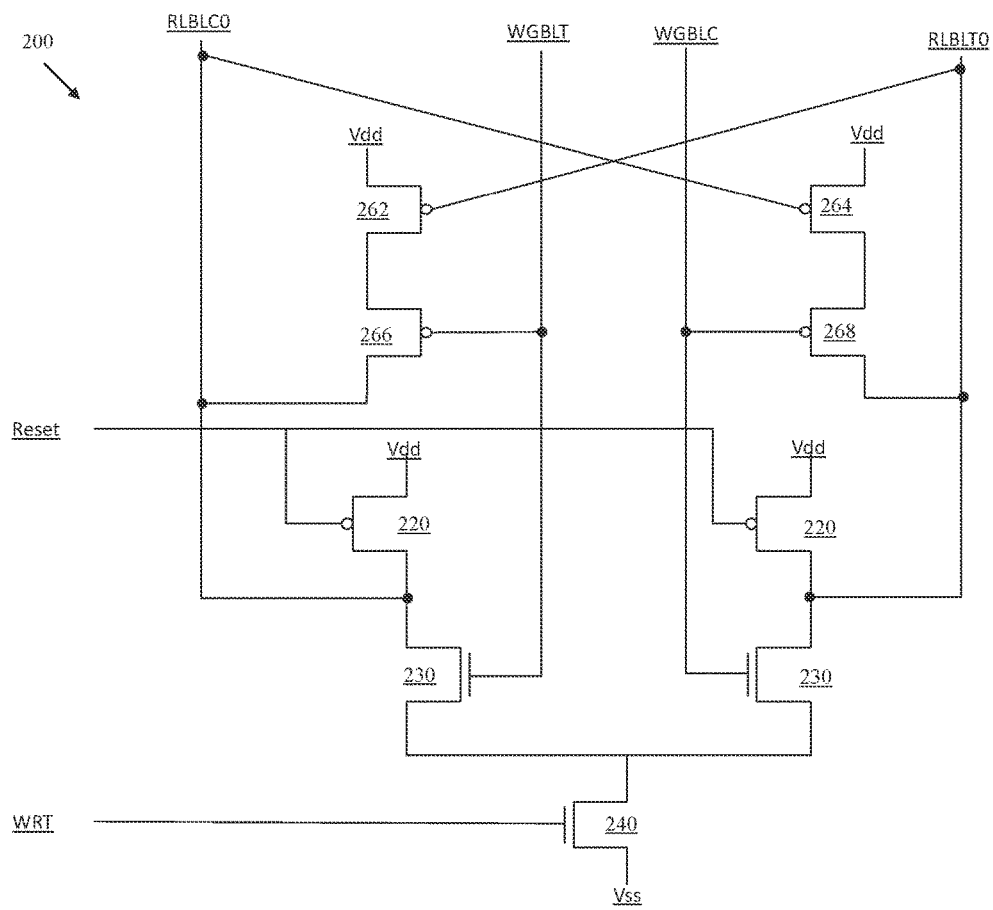
FIG. 5 depicts a local bit-select circuit featuring gated cross-coupled PFETs according to one or more embodiments of the invention.

FIG. 5 depicts a local bit-select circuit featuring gated cross-coupled PFETs according to one or more embodiments of the invention. The local bit-select circuit 200 includes a pair of pull-up devices 220 or "reset" devices which can be implemented using PFETs having source terminals connected to a power supply voltage Vdd and drain terminals connected to respective read local bitlines RLBLC0 and RLBLT0. The gate terminals of these pair of pull-up devices 220 are connected to a reset signal. These devices 220 can be used to pull up the value of the read local bitlines to Vdd prior to reading from or writing to a memory cell connected to the read local bitlines. The power supply voltage Vdd typically is the same as that which supplies power to each of the memory cells of the SRAM 100 (from FIG. 4).

In one or more embodiments of the invention, the local bit-select circuit 200 also includes pull-down devices 230, which can be implemented using NFETs, for example. The pull-down devices 230 include gates connected to write global bitlines WGBLT and WGBLC and sources connected to a drain of a write control device 240. The write control device 240 can be implemented using an NFET, for example. During a write operation, the SRAM memory cell is activated to be written, such as by raising a voltage on a wordline connected to the memory cell. At that time, the write global bitlines WVBLT and WGBLC are supplied with write bit values. Then, a write control signal WRT draws current through the wire control device 240 which in turn activates the pull-down devices 230 to cause the bit value on one of the RLBLT0 and RLBLC0 to be driven to the low signal level.

In one or more embodiments of the invention, the local bit-select circuit 200 includes four pull-up devices 262, 264, 266, and 268 that can be implemented using PFETs. The first pull-up device 262 includes a source terminal connected to the power supply voltage Vdd, a drain terminal connected to a source terminal of the third pull-up device 266, and a gate terminal connected to the read local bit line true RLBLT0. The second pull-up device 264 includes a source terminal connected to the power supply voltage Vdd, a drain terminal connected to a source terminal of the fourth pull-up device 268, and a gate terminal connected to the read local bit line compliment RLBLC0. The third pull-up device 266 includes a drain terminal connected to the read local bit line compliment RLBLC0 and a gate terminal connected to the write global bit line true WGBLT. The fourth pull-up device 268 includes a drain terminal connected to the read local bit line true RLBLT0 and a gate terminal connected to the write global bit line complement WGBLC.

In one or more embodiments of the invention, the local bit-select circuit 200 having the gated cross-coupled PFETs 262, 264, 266, 268 guards against the fast read before write (FRBW) issue described above. If a FRBW occurs, it causes the RLBLT0 to droop down turning on the cross coupled PFET 262 connected to the RLBLC0. The write data WGBLT will transition high turning off (PFET 266) the conduction path from Vdd to RLBLC0 so it will block conduction to the RLBLC0 keeping it low. With the RLBLC0 low, the PFET 264 will be turned on and since this is a write operation for writing a "1" to the memory cell, the PFET 268 will be turned on because WGBLC is low. This causes a conduction path between the Vdd and the RLBLT0 to be driven high due to both PFETs 264, 268 to be turned on. Referring to FIG. 5, during a typical read operation, the state of WGBLC & WGBLT will be at low voltage state (Vss) and remain at this state during the read operation. The Reset and the WRT signal will transition from a low voltage state (Vss) to a high voltage state (Vdd). At the same time, the wordline signal (not shown) will transition from a low voltage state (Vss) to a high voltage state (Vdd) thus turning on the memory cell pass-gate NFET transistors, thus allowing its cell content to be presented to the local bit lines RLBLC0 & RLBLT0. During a Write operation, the only difference from a read operation described above, is that one of the signals WGBLC and WGBLT will transition from a low voltage state (Vss) to a high voltage state (Vdd).

Figure 6:
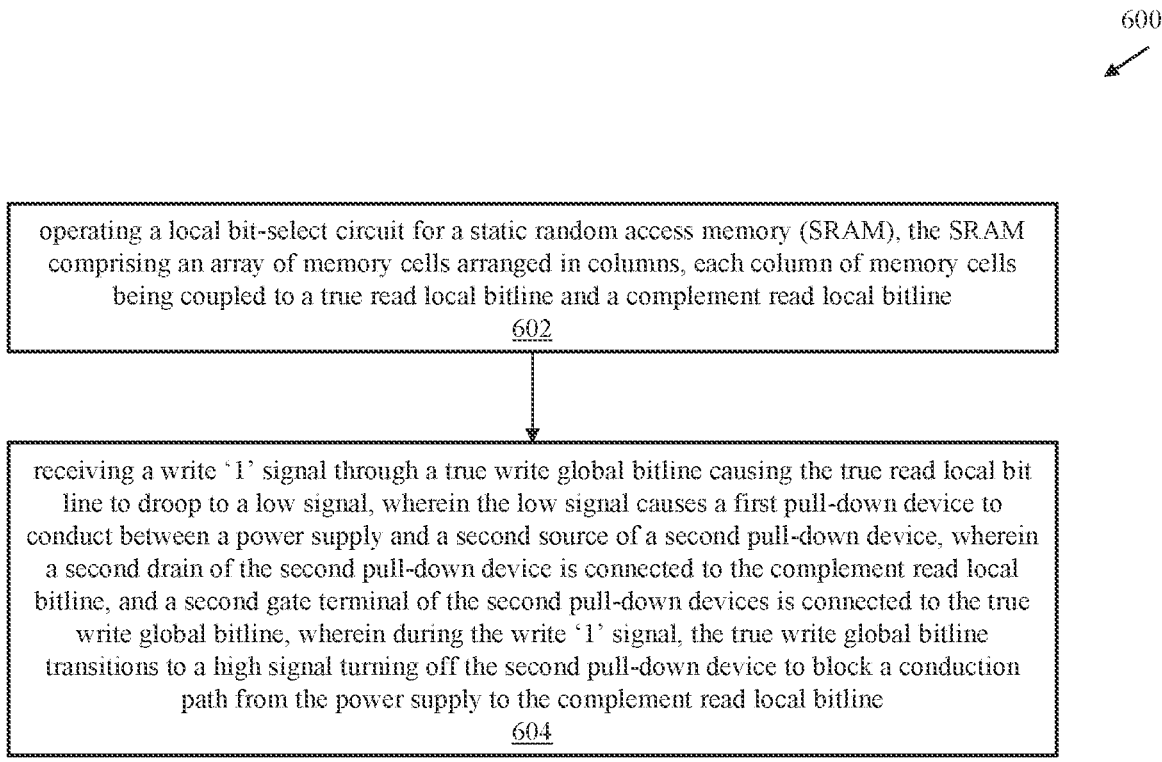
FIG. 6 depicts a flow diagram of a method for operating a local-bit select circuit according to one or more embodiments of the invention.

FIG. 6 depicts a flow diagram of a method 600 for operating an SRAM with gated cross-coupled PFETs according to one or more embodiments of the invention. The method 600 includes operating a local bit-select circuit for a static random access memory (SRAM), the SRAM including an array of memory cells arranged in columns, each column of memory cells being coupled to a true read local bitline and a complement read local bitline, as shown in block 602. And at block 604, the method 600 includes receiving a write '1' signal through a true write global bitline causing the true read local bit line to droop to a low signal, wherein the low signal causes a first pull-down device to conduct between a power supply and a second source of a second pull-down device, wherein a second drain of the second pull-down device is connected to the complement read local bitline, and a second gate terminal of the second pull-down devices is connected to the true write global bitline, wherein during the write '1' signal, the true write global bitline transitions to a high signal turning off the second pull-down device to block a conduction path from the power supply to the complement read local bitline.

Additional processes may also be included. It should be understood that the processes depicted in FIG. 6 represent illustrations, and that other processes may be added or existing processes may be removed, modified, or rearranged without departing from the scope and spirit of the present disclosure.

Figure 7:
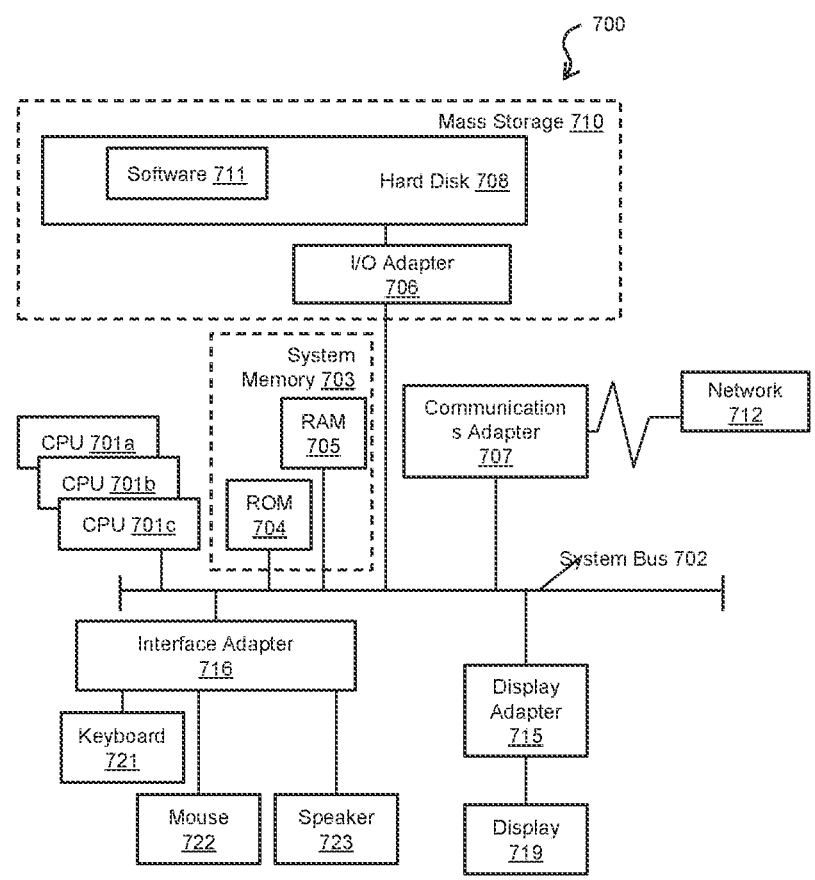
FIG. 7 depicts a computer system in accordance with an embodiment.

Turning now to FIG. 7, a computer system 700 is generally shown in accordance with an embodiment. The computer system 700 can be an electronic, computer framework comprising and/or employing any number and combination of computing devices and networks utilizing various communication technologies, as described herein. The computer system 700 can be easily scalable, extensible, and modular, with the ability to change to different services or reconfigure some features independently of others. The computer system 700 may be, for example, a server, desktop computer, laptop computer, tablet computer, or smartphone. In some examples, computer system 700 may be a cloud computing node. Computer system 700 may be described in the general context of computer system executable instructions, such as program modules, being executed by a computer system. Generally, program modules may include routines, programs, objects, components, logic, data structures, and so on that perform particular tasks or implement particular abstract data types. Computer system 700 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, the computer system 700 has one or more central processing units (CPU(s)) 701a, 701b, 701c, etc. (collectively or generically referred to as processor(s) 701). The processors 701 can be a single-core processor, multi-core processor, computing cluster, or any number of other configurations. The processors 701, also referred to as processing circuits, are coupled via a system bus 702 to a system memory 703 and various other components. The system memory 703 can include a read only memory (ROM) 704 and a random access memory (RAM) 705. The ROM 704 is coupled to the system bus 702 and may include a basic input/output system (BIOS), which controls certain basic functions of the computer system 700. The RAM is read-write memory coupled to the system bus 702 for use by the processors 701. The system memory 703 provides temporary memory space for operations of said instructions during operation. The system memory 703 can include random access memory (RAM), read only memory, flash memory, or any other suitable memory systems.

The computer system 700 comprises an input/output (I/O) adapter 706 and a communications adapter 707 coupled to the system bus 702. The I/O adapter 706 may be a small computer system interface (SCSI) adapter that communicates with a hard disk 708 and/or any other similar component. The I/O adapter 706 and the hard disk 708 are collectively referred to herein as a mass storage 710.

Software 711 for execution on the computer system 700 may be stored in the mass storage 710. The mass storage 710 is an example of a tangible storage medium readable by the processors 701, where the software 711 is stored as instructions for execution by the processors 701 to cause the computer system 700 to operate, such as is described herein below with respect to the various Figures. Examples of computer program product and the execution of such instruction is discussed herein in more detail. The communications adapter 707 interconnects the system bus 702 with a network 712, which may be an outside network, enabling the computer system 700 to communicate with other such systems. In one embodiment, a portion of the system memory 703 and the mass storage 710 collectively store an operating system, which may be any appropriate operating system, such as the z/OS or AIX operating system from IBM Corporation, to coordinate the functions of the various components shown in FIG. 7.

Additional input/output devices are shown as connected to the system bus 702 via a display adapter 715 and an interface adapter 716 and. In one embodiment, the adapters 706, 707, 715, and 716 may be connected to one or more I/O buses that are connected to the system bus 702 via an intermediate bus bridge (not shown). A display 719 (e.g., a screen or a display monitor) is connected to the system bus 702 by a display adapter 715, which may include a graphics controller to improve the performance of graphics intensive applications and a video controller. A keyboard 721, a mouse 722, a speaker 723, etc. can be interconnected to the system bus 702 via the interface adapter 716, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI). Thus, as configured in FIG. 7, the computer system 700 includes processing capability in the form of the processors 701, and, storage capability including the system memory 703 and the mass storage 710, input means such as the keyboard 721 and the mouse 722, and output capability including the speaker 723 and the display 719.

In some embodiments, the communications adapter 707 can transmit data using any suitable interface or protocol, such as the internet small computer system interface, among others. The network 712 may be a cellular network, a radio network, a wide area network (WAN), a local area network (LAN), or the Internet, among others. An external computing device may connect to the computer system 700 through the network 712. In some examples, an external computing device may be an external webserver or a cloud computing node.

It is to be understood that the block diagram of FIG. 7 is not intended to indicate that the computer system 700 is to include all of the components shown in FIG. 7. Rather, the computer system 700 can include any appropriate fewer or additional components not illustrated in FIG. 7 (e.g., additional memory components, embedded controllers, modules, additional network interfaces, etc.). Further, the embodiments described herein with respect to computer system 700 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media)

having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A local bit-select circuit comprising:
a first set of pull-down devices comprising a first pull-down device and a second pull-down device, wherein a first source terminal of the first pull-down device is connected to a voltage supply, wherein a first drain terminal of the first pull-down device is directly connected to a second source terminal of the second pull-down device via a connection line, and wherein the connection line is distinct from a compliment read local bit line, wherein a first gate terminal of the first pull-down device is connected to a true read local bitline, and wherein the first drain terminal of the first pull-down device is disconnected from the compliment read local bit line while the second pull-down device is in an open state;
wherein a second drain terminal of the second pull-down device is connected to the compliment read local bit line, and wherein a second gate terminal of the second pull-down device is connected to a true write global bitline;
a second set of pull-down devices comprising a third pull-down device and a fourth pull-down device, wherein a third source terminal of the third pull-down device is connected to the voltage supply, wherein a third drain terminal of the third pull-down device is directly connected to a fourth source terminal of the fourth pull-down device via a connection line distinct from the true read local bit line, wherein a third gate terminal of the third pull-down device is connected to the compliment read local bitline, and wherein the third drain terminal of the third pull-down device is disconnected from the compliment read local bit line while the fourth pull-down device is in an open state; and
wherein a fourth drain terminal of the fourth pull-down device is connected to the true read local bitline, and wherein a fourth gate terminal of the fourth pull-down device is connected to a compliment write global bit line.

2. The local bit-select circuit of claim 1, further comprising:
a third set of pull-down devices comprising a fifth pull-down device and a sixth pull-down device, wherein a fifth source terminal of the fifth pull-down device is connected to the voltage supply, and wherein a sixth source terminal of the sixth pull-down device is connected to the voltage supply;
wherein a fifth drain terminal of the fifth pull-down device is connected to the compliment read local bitline, and wherein a sixth drain terminal of the sixth pull-down device is connected to the true read local bitline.

3. The local bit-select circuit of claim 2, wherein a fifth gate of the fifth pull-down device is connected to a reset signal, and wherein a sixth gate of the sixth pull-down device is connected to the reset signal.

4. The local bit-select circuit of claim 2, further comprising:
a first set of pull-up devices comprising a first pull-up device and a second pull-up device, wherein a first gate terminal of the first pull-up device is connected to the true write global bitline, and wherein a second gate terminal of the second pull-up device is connected to the compliment write global bitline.

5. The local bit-select circuit of claim 4, wherein a first source of the first pull-up device is connected to the compliment read local bitline.

6. The local bit-select circuit of claim 4, wherein a first source of the first pull-up device is connected to the fifth drain terminal of the fifth pull-down device.

7. The local bit-select circuit of claim 4, wherein a second source of the second pull-up device is connected to the true read local bitline.

8. The local bit-select circuit of claim 4, wherein a second source of the second pull-up device is connected to a sixth drain terminal of the sixth pull-down device.

9. The local bit-select circuit of claim 4, wherein the first set of pull-up devices further comprises a third pull-up device, wherein a third source of the third pull-up device is connected to a first drain of the first pull-up device and a second drain of the second pull-up device.

10. The local bit-select circuit of claim 9, wherein a third gate of the third pull-up device is connected to a write control signal.

11. The local bit-select circuit of claim 4, wherein the first pull-up device comprises an n-type field effect transistor (NFET).

12. The local bit-select circuit of claim 1, wherein the first pull-down device comprises a p-type field effect transistor (PFET).

13. An integrated circuit including static random access memory (SRAM) comprising:
a SRAM array comprising an array of memory cells arranged in columns, each column of memory cells being coupled to a true and complement read local bitlines;
a local bit-select circuit connected to memory cells of the SRAM array, the local bit-select circuit comprising:
a first set of pull-down devices comprising a first pull-down device and a second pull-down device, wherein a first source terminal of the first pull-down device is connected to a voltage supply, wherein a first drain terminal of the first pull-down device is connected to a second source terminal of the second pull-down device via a connection distinct from the compliment read local bit line, wherein a first gate terminal of the first pull-down device is connected to the true read local bitline, and wherein the first drain terminal of the first pull-down device is disconnected from the compliment read local bit line while the second pull-down device is in an open state;
wherein a second drain terminal of the second pull-down device is connected to the compliment read local bitline, and wherein a second gate terminal of the second pull-down device is connected to a true write global bitline;
a second set of pull-down devices comprising a third pull-down device and a fourth pull-down device, wherein a third source terminal of the third pull-down device is connected to the voltage supply, wherein a third drain terminal of the third pull-down device is connected to a fourth source terminal of the fourth pull-down device via a connection distinct from the true read local bit line, wherein a third gate terminal of the third pull-down device is connected to the compliment read local bitline, and wherein the third drain terminal of the third pull-down device is disconnected from the compliment read local bit line while the fourth pull-down device is in an open state; and wherein a fourth drain terminal of the fourth pull-down device is connected to the true read local bitline, and wherein a fourth gate terminal of the fourth pull-down device is connected to a compliment write global bit line.

14. The integrated circuit of claim 13, wherein the local bit-select circuit further comprises:
a third set of pull-down devices comprising a fifth pull-down device and a sixth pull-down device, wherein a fifth source terminal of the fifth pull-down device is connected to the voltage supply, and wherein a sixth source terminal of the sixth pull-down device is connected to the voltage supply;
wherein a fifth drain terminal of the fifth pull-down device is connected to a compliment read local bitline, and wherein the sixth drain terminal of the sixth pull-down device is connected to the true read local bitline.

15. The integrated circuit of claim 14, wherein a fifth gate of the fifth pull-down device is connected to a reset signal, and wherein a sixth gate of the sixth pull-down device is connected to the reset signal.

16. The integrated circuit of claim 14, wherein the local bit-select circuit further comprises:
a first set of pull-up devices comprising a first pull-up device and a second pull-up device, wherein a first gate terminal of the first pull-up device is connected to the true write global bitline, and wherein a second gate terminal of the second pull-up device is connected to the compliment write global bitline.

17. The integrated circuit of claim 16, wherein a first source of the first pull-up device is connected to the compliment read local bitline.

18. The integrated circuit of claim 16, wherein a second source of the second pull-up device is connected to the true read local bitline.

19. A method comprising:
operating a local bit-select circuit for a static random access memory (SRAM), the SRAM comprising an array of memory cells arranged in columns, each column of memory cells being coupled to a true read local bitline and a complement read local bitline, wherein the operating comprises:
receiving a write '1' signal through a true write global bitline causing the true read local bit line to droop to a low signal, wherein the low signal causes a first pull-down device to conduct between a power supply and a second source of a second pull-down device, wherein a second drain of the second pull-down device is connected to the complement read local bitline, and a second gate terminal of the second pull-down devices is connected to the true write global bitline;
wherein during the write '1' signal, the true write global bitline transitions to a high signal turning off the second pull-down device to block a conduction path from the power supply to the complement read local bitline; and
further comprising receiving a write '0' signal through the true write global bitline causing a complement write global bitline to transition to a high signal, wherein the high signal causes a complement read local bit line to droop to a second low signal, wherein the second low signal causes a third pull-down device to conduct between the power supply and a fourth source of a fourth pull-down device, wherein a fourth drain of the fourth pull-down device is connected to the true read local bitline, and a fourth gate terminal of the further pull-down device is connected to the complement write global bitline, wherein during the write '0' signal, the compliment write global bitline transitions to a high signal turning off the fourth pull-down device to block a second conduction path from the power supply to the true read local bitline.

* * * * *